(12) United States Patent
Yen et al.

(10) Patent No.: US 8,716,848 B2
(45) Date of Patent: May 6, 2014

(54) LED DEVICE WITH CONDUCTIVE WINGS AND TABS

(75) Inventors: Jui-Kang Yen, Taipei (TW); Yung-Wei Chen, Taichung (TW)

(73) Assignee: SemiLEDS Optoelectronics Co., Ltd., Chu-Nan (TW)

(\*) Notice: Subject to any disclaimer, the term of this patent is extended or adjusted under 35 U.S.C. 154(b) by 1234 days.

(21) Appl. No.: 12/053,957

(22) Filed: Mar. 24, 2008

(65) Prior Publication Data
US 2009/0236625 A1    Sep. 24, 2009

(51) Int. Cl.
*H01L 23/495* (2006.01)
(52) U.S. Cl.
USPC .......................................................... 257/676
(58) Field of Classification Search
USPC .................... 257/81, 82, 89, 713, 676
See application file for complete search history.

(56) References Cited

U.S. PATENT DOCUMENTS

| 6,501,156 B1 * | 12/2002 | Nakanishi et al. | 257/666 |
| 6,583,447 B2 * | 6/2003 | Wang et al. | 257/99 |
| 7,224,047 B2 * | 5/2007 | Carberry et al. | 257/676 |

\* cited by examiner

*Primary Examiner* — Jae Lee
(74) *Attorney, Agent, or Firm* — Stephen A. Gratton (57) ABSTRACT

Apparatus for increased heat dissipation from a light-emitting diode (LED) die are provided. The apparatus may include a metal member thermally and electrically coupled to the LED die and having one or more wings for heat transfer away from the LED die and/or increased mechanical strength of the metal member. The wings may be flat, sloped, or tiered. For some embodiments, the wings may have holes in them in an effort to increase the structural integrity when combined with a housing, which made be composed of plastic or resin.

5 Claims, 8 Drawing Sheets

FIG. 9

LED DEVICE WITH CONDUCTIVE WINGS AND TABS

FIELD OF THE INVENTION

Embodiments of the present invention relate to the field of light-emitting diode (LED) technology and, more particularly, to LED packaging for increased heat dissipation.

BACKGROUND OF THE INVENTION

Heat transfer management is a concern for designers of light-emitting diodes (LEDs). When LEDs are driven with high currents, high device temperatures may occur because of insufficient heat transfer from the p-n junction of the semiconductor die to the ambient environment. Such high temperatures can harm the semiconductor and lead to such degradations as accelerated aging, separation of the LED chip from the lead frame, and breakage of bond wires.

In addition to the aforementioned problems, the optical properties of the LED vary with temperature, as well. As an example, the light output of an LED typically decreases with increased junction temperature. Also, the emitted wavelength can change with temperature due to a change in the semiconductor bandgap energy.

The main path for heat dissipation (thermal path) in prior art is from the p-n junction to the lead frame and then through the ends of the leads via heat conduction. At the ends of the leads, heat conduction, convection and radiation serve to transfer heat away from the LED when mounted on a printed circuit board (PCB). There is also a secondary path of heat conduction from the surface of the semiconductor die to the surface of the plastic casing. The problem with this design is that the majority of the lead frame sits within the plastic casing, which acts as a thermal insulator, and the main path for heat dissipation out of the device is limited by the size of the leads. Even designs that have added to the size or number of leads in an effort to promote heat transfer still possess an inherent bottleneck for heat dissipation, as the leads are still sandwiched in the thermally insulative plastic casing.

SUMMARY OF THE INVENTION

One embodiment of the present invention provides a light-emitting diode (LED) device. The LED device generally includes a housing having a recessed volume; an LED semiconductor die having first and second electrodes and disposed in the recessed volume of the housing; a first metal member having one or more leads for external connection and one or more wings for heat dissipation, wherein the first metal member is electrically and thermally coupled to the first electrode of the LED die; and a second metal member having one or more leads for external connection, the second metal member being electrically coupled to the second electrode of the LED die.

Another embodiment of the present invention provides an LED device. The LED device generally includes a housing having a recessed volume; an LED semiconductor die having first and second electrodes and disposed in the recessed volume of the housing; a first metal member having one or more leads for external connection and one or more wings for heat dissipation, wherein the first metal member is electrically and thermally coupled to a first electrode of the LED die; a second metal member having one or more leads for external connection, the second metal member being electrically coupled to the second electrode of the LED die; and a third metal member having one or more leads for external connection, the third metal member being electrically coupled to the second electrode of the LED die.

Yet another embodiment of the present invention provides an LED device. The LED device generally includes a housing having a recessed volume; an LED semiconductor die disposed in the recessed volume of the housing; a first metal member having one or more leads for external connection and one or more wings for heat dissipation, wherein the first metal member is electrically and thermally coupled to a first electrode of the LED die; a second metal member having one or more leads for external connection, the second metal member being electrically coupled to a second electrode of the LED die; and a third metal member having one or more leads for external connection, the third metal member being electrically coupled to a third electrode of the LED die.

BRIEF DESCRIPTION OF THE DRAWINGS

FIG. 1B is a cross-sectional schematic representation of the low thermal resistance LED shown in FIG. 1a;

FIG. 3B is a cross-sectional schematic representation of the low thermal resistance LED shown in FIG. 3a;

DETAILED DESCRIPTION OF THE PREFERRED EMBODIMENTS

Embodiments of the present invention provide an improved heat transfer path with a lower thermal resistance than conventional LEDs without significantly deviating from the conventional dimensions. For some embodiments, a surface-mountable light-emitting diode structure is provided that includes a lead frame that is substantially exposed for low thermal resistance by positioning it on the bottom of the light-emitting diode structure. A light-emitting diode semiconductor chip is electrically and thermally conductively connected by solder to a first lead of the lead frame for external connection.

The LED chip may be electrically connected through a bond wire to a second lead of the lead frame for external connection. A housing sitting on top of the first and second leads may provide a recessed volume that is filled with an encapsulation resin or a transparent resin and further covered by a transparent cover plate or lens. In this manner, heat may be efficiently conducted from the p-n junction of the semiconductor directly through the first lead which can be heat sunk on a printed circuit board through a large surface plane, for example. For some embodiments, the leads can extend beyond the confines of the housing for even lower thermal resistance.

AN EXEMPLARY LED STRUCTURE

Figure 1A:
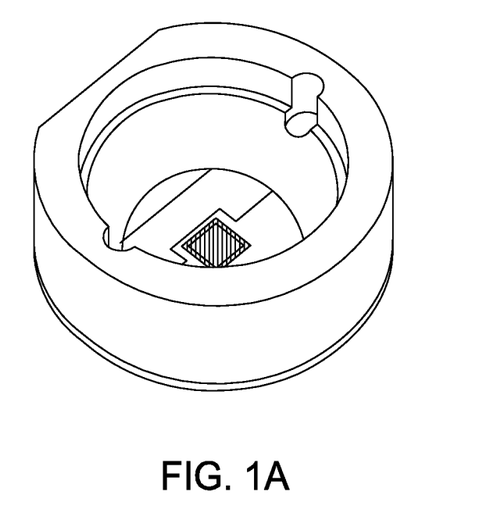
FIG. 1A is a 3-D image of a low thermal resistance LED according to one embodiment of the invention.
Figure 1B:
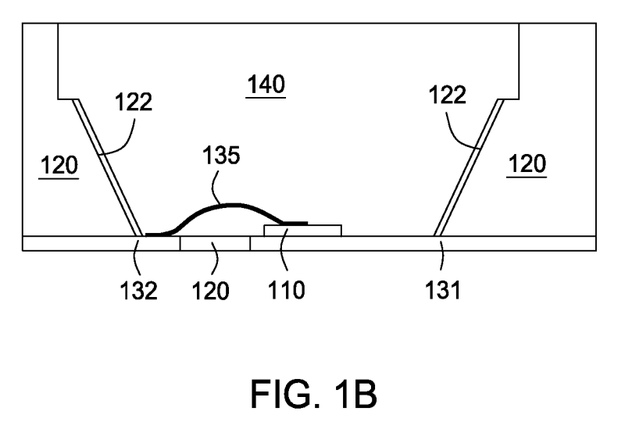

FIG. 1b is a cross-sectional schematic representation of a light-emitting diode (LED) with low thermal resistance, in accordance with one embodiment of the invention. A three-dimensional depiction of the LED is shown in FIG. 1a. This schematic shows an LED chip 110 attached to a first lead 131 by metal solder or some other type of suitable heat-conducting material. The LED chip 110 can represent one or more active LED die and may comprise one of several semiconductor materials, such as GaAs, AlGaAs, AlGaP, AlGaInP, GaAsP, GaP, InGaN, AlN, GaN, or AlGaN. To create electrical properties characteristic of a diode, one side of the LED chip 110 is doped with intentional impurities to create a p-doped side (not shown), while an n-doped side (also not shown) is created on another side of the LED chip 110.

The first lead 131 may be intimately connected to the p-doped side of the LED chip 110 for efficient heat transfer immediately away from the LED chip 110. A second lead 132 is electrically connected to the LED chip 110 through a bond wire 135, made of a conductive material, such as gold. For some embodiments, the first lead 131 may be made as large as possible (within the dimensions of the LED package) in an effort to allow for greater heat transfer and, in such cases, will typically be larger than the second lead 132.

In any case, the lead frame (consisting of both leads 131, 132 and the bond wire 135) may be positioned at the bottom of the device, which may result in lower thermal resistance and better heat-sinking capability than the prior art. In the illustrated example, the LED is encased in a cylindrical housing 120 composed of an insulating material such as plastic. Inner surfaces of the housing 120 may have a slope to them and may be coated with a reflective material 122. The recessed volume inside the housing 120 may be filled with an encapsulation resin 140.

As illustrated, a first surface of each of the leads 131,132 may be enclosed in the housing 120, while a second surface of each of the leads 131, 132 may be substantially exposed through (a bottom portion of) the housing. For example, 10-50% or more of the second surface of one or both of the leads 131, 132 may be exposed. This substantial exposure of the lead(s) to the external world (for connection to a PCB or other type of mounting surface) may greatly enhance thermal conductivity.

In other variations of this embodiment of an LED with low thermal resistance, the leads 131, 132 may extend radially beyond the housing 120. In addition, the housing 120 may have a different shape with leads 131, 132 to match (e.g. a hollowed-out rectangular prism with rectangular leads), and these leads 131, 132 may also extend laterally beyond the housing 120.

Figure 2:
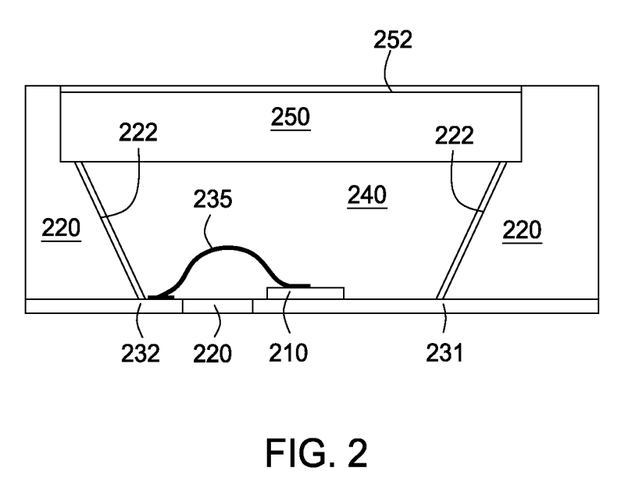
FIG. 2 is a cross-sectional schematic representation of a low thermal resistance LED according to one embodiment of the invention.

FIG. 2 is a cross-sectional schematic representation of an LED with low thermal resistance, in accordance with another embodiment of the invention. This schematic shows an LED chip 210 attached to a first lead 231 by metal solder or other type of suitable heat-conducting material.

The LED chip 210 can represent one or more active LED die. A second lead 232 is electrically connected to the LED chip 210 through a bond wire 235, made of a conductive material, such as gold. For some embodiments, the first lead 231 may be made as large as possible (within the dimensions of the LED package) in an effort to allow for greater heat transfer and, in such cases, will typically be larger than the second lead 232.

In any case, the lead frame (consisting of both leads 231, 232 and the bond wire 235) may be positioned at the bottom of the device, which may result in lower thermal resistance and better heat-sinking capability than the prior art. In the illustrated example, the LED is encased in a cylindrical housing 220 composed of an insulating material such as plastic. Inner surfaces of the housing 220 may have a slope to them and may be coated with a reflective material 222.

The recessed volume inside the housing 220 may be filled partway with an encapsulation resin 240 and covered with a transparent cover plate 250. For example, this cover plate 250 may be coated with phosphor 252 to convert one wavelength of light to another wavelength. Another option may be to coat the cover plate 250 with a light absorber to absorb the UV light.

Figure 4:
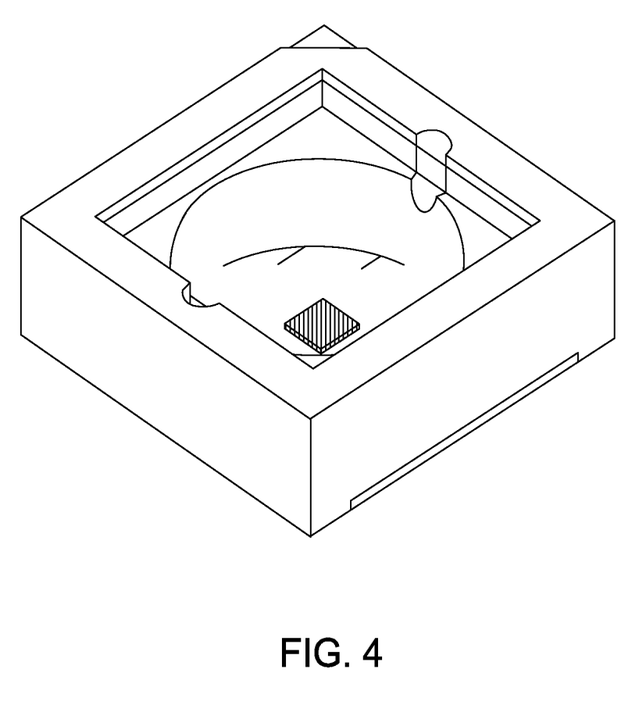
FIG. 4 is a 3-D image of the low thermal resistance LED shown in FIG. 2, but with a cuboidal housing instead of a cylindrical one.

In other variations of this embodiment of an LED with low thermal resistance, the leads 231, 232 may extend radially beyond the housing 220. In addition, the housing 220 may have a different shape with leads 231, 232 to match (e.g. a hollowed-out rectangular prism with rectangular leads as shown in FIG. 4), and these leads 231, 232 may also extend laterally beyond the housing 220.

Figure 3A:
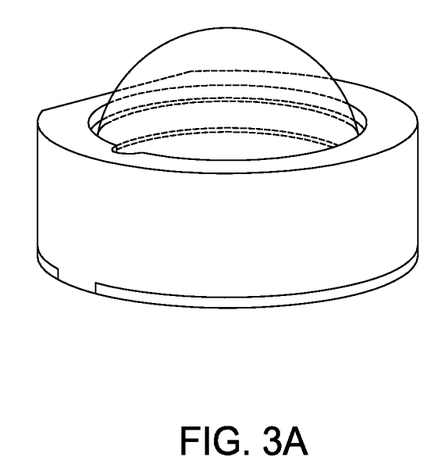
FIG. 3A is a 3-D image of a low thermal resistance LED according to one embodiment of the invention.
Figure 3B:
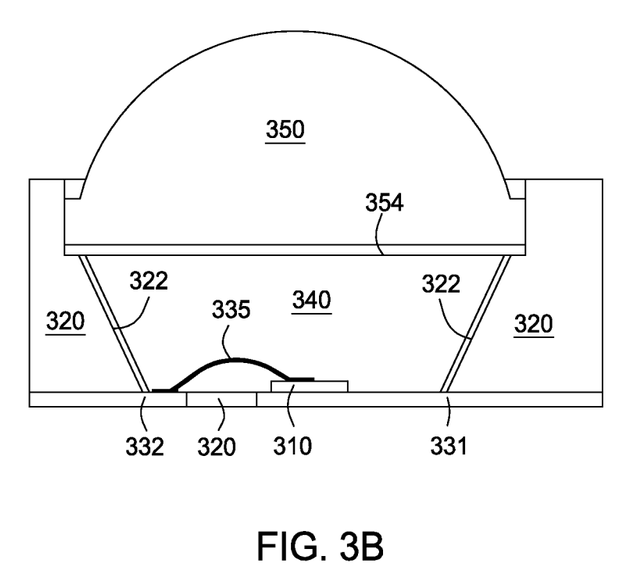

FIG. 3b is a cross-sectional schematic representation of a light-emitting diode (LED) with low thermal resistance, in accordance with another embodiment of the invention. A three-dimensional depiction of the LED is shown in FIG. 3a. This schematic shows an LED chip 310 attached to a first lead 331 by metal solder or some other type of suitable heat-conducting material.

The LED chip 310 can represent one or more active LED die. A second lead 332 is electrically connected to the LED chip 310 through a bond wire 335, made of a conductive material, such as gold. For some embodiments, the first lead 331 may be made as large as possible (within the dimensions of the LED package) in an effort to allow for greater heat transfer and, in such cases, will typically be larger than the second lead 332.

In any case, the lead frame (consisting of both leads 331, 332 and the bond wire 335) may be positioned at the bottom of the device, which may result in lower thermal resistance and better heat-sinking capability than the prior art. In the illustrated example, the LED is encased in a cylindrical housing 320 composed of an insulating material such as plastic. Inner surfaces of the housing 320 may have a slope to them and may be coated with a reflective material 322. The recessed volume inside the housing 320 is filled partway with an encapsulation resin 340 and covered with a transparent lens 350 that can be used to change the emitting angle of the light. The bottom of the lens 350 may be coated with phosphor 354 to convert one wavelength of light to another wavelength. Another option may be to coat the bottom of the lens 350 with a light absorber to absorb the UV light.

Figure 5:
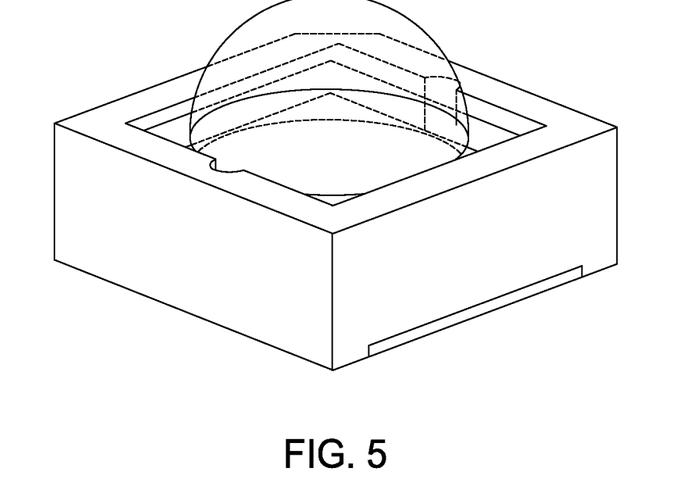
FIG. 5 is a 3-D image of the low thermal resistance LED shown in FIG. 3a, but with a cuboidal housing instead of a cylindrical one.
Figure 6:
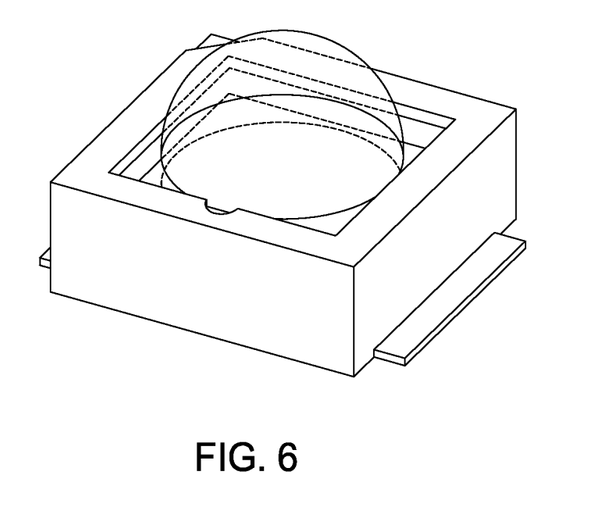
FIG. 6 is a 3-D image of the low thermal resistance LED shown in FIG. 5 depicting how the leads can be extended beyond the housing.

In other variations of this embodiment of an LED with low thermal resistance, the leads 331, 332 may extend radially beyond the housing 320. In addition, the housing 320 may have a different shape with leads 331, 332 to match (e.g., a hollowed-out rectangular prism with rectangular leads as shown in FIG. 5), and these leads 331, 332 may also extend laterally beyond the housing 320 as shown in FIG. 6.

ANOTHER EXEMPLARY LED STRUCTURE

Figure 7A:
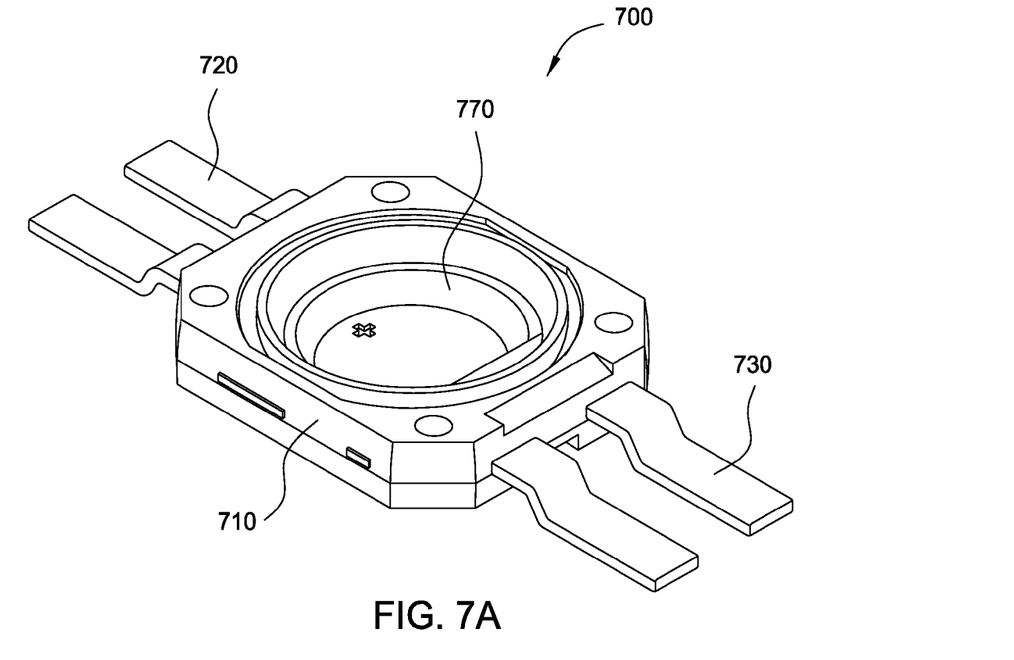
FIGS. 7A-7D illustrate an LED device with wings in a lead frame according to embodiments of the invention.

FIG. 7A illustrates one embodiment of an LED package 700. Like FIG. 6, a first lead 720 and a second lead 730 extend beyond the housing 710. The first lead 720 may consist of a first sheet metal member, while the second lead 730 may consist of a second sheet metal member. As described above, the housing 720 may be constructed of an electrically and thermally insulative plastic or resin, wherein the plastic or resin housing may be fabricated by a molding or injection molding process.

Further, inner surfaces of the housing may be recessed producing a cavity 770, wherein the cavity 770 may have a slope to it which may be coated with a reflective material. In some embodiments, the cavity may be circular, square, rectangular, or oval in shape. Further, in some embodiments the cavity may be formed in a single, double, or triple tiered layer within the housing. Additionally, surfaces of the cavity may be fabricated from metal, plastic, or resin. In some embodiments, the reflective material which may coat the cavity may contain Ag, Al, Ni, Pd, Au, Pt, Ti, Cr, or an optical film.

In some embodiments, the side of the LED package 700 which emits light may be flat, concave, or convex and perform optical functions such as focusing or dispersing light. This side may comprise a lens, a transparent layer, and/or one or more wavelength-converting layers.

Figure 7B:
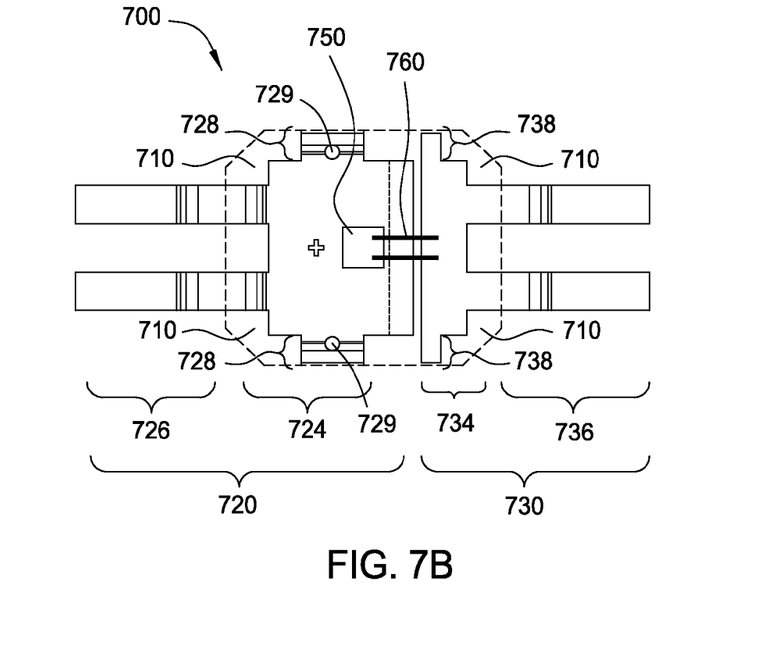

FIG. 7B illustrates a top view of the LED package 700 having the housing 710 removed. The first sheet metal member 720 may be intimately connected to the p-doped side of the LED chip 750, which may be a vertical LED (VLED) chip, for efficient heat transfer immediately away from the LED chip 750. The second sheet metal member 730 may be electrically connected to the LED chip 750 through a bond wire 760, made of a conductive material, such as gold. For some embodiments, the first sheet metal member 720 may be made as large as possible (within the dimensions of the LED package) in an effort to allow for greater heat transfer and, in such cases, will typically be larger than the second sheet metal member 730.

The first sheet metal member 720 may be divided into different regions comprising an electrode region 724, which includes a large heat transfer section; one or more electric terminals 726; and at least one wing 728. Similarly, the second sheet metal member 730 may also be divided into different regions comprising an electrode region 734, which includes a large heat transfer section; one or more electric terminals 736; and at least one wing 738. As used herein, a wing generally refers to a protrusion or extension from the main body, such as the large heat transfer section, of a sheet metal member. By providing one or more wings to the first sheet metal member 720 and second sheet metal member 730, the sheet metal members may have lower thermal resistance. Additionally, the LED package 700 with wings may have increased structural integrity when compared to conventional LED packages without wings.

In some embodiments, the wings may be flat, with the same elevation as the remainder of the corresponding sheet metal member. In other embodiments, the wings may be sloped or tiered above or below the remainder of the corresponding sheet metal member. A sloped or tiered wing may most likely be longer than a corresponding flat wing, if both alternatives were to extend to the edge of the housing 710. Accordingly, a sloped or tiered wing may dissipate additional heat when compared to a flat wing. Moreover, a sloped or tiered wing may raise the cross-sectional area of the wing away from the PCB, allowing for increased heat dissipation through convection at the ends of the wings.

For some embodiments, a sheet metal member may have two or more wings on a single side. For example, an LED package may have a combination of flat and sloped or tiered wings, increasing the surface area and, consequently, increasing the ability to dissipate heat. Note, however, that performance enhancements related to additional heat dissipation offered by a combination of flat and sloped or tiered wings may be offset by additional manufacturing costs.

In some embodiments, the one or more wings may be corrugated, thus increasing the surface area of the wing and corresponding heat dissipation. In some embodiments, one or more wings may have one or more holes 729 that may be cylindrical or conical in shape, thus providing additional structural integrity.

Figure 7C:
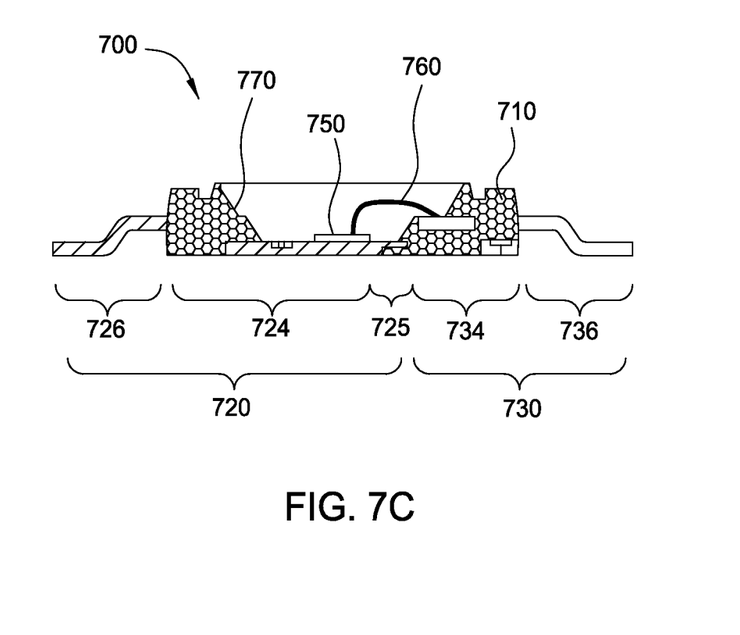
Figure 7D:
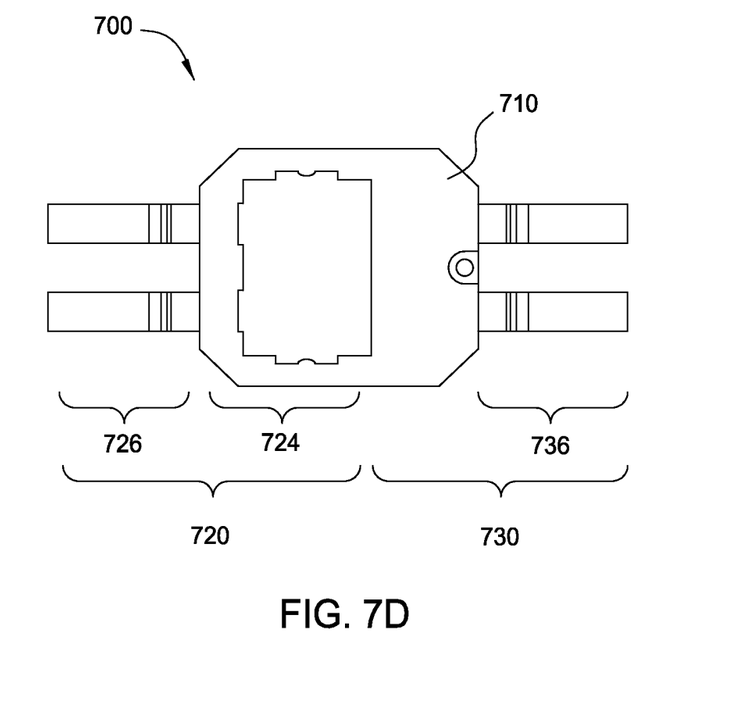

FIG. 7C illustrates a cross-sectional view of LED package 700, while FIG. 7D illustrates a bottom view of LED package 700. Illustrated in both FIG. 7C and FIG. 7D, are the first sheet metal member 720, the second sheet metal member 730, and the corresponding electric terminals 726 and 736, respectively. A portion 725 of the first sheet metal member 720 beneath the LED chip 750 may be thinner than the electric terminal 726. FIG. 7D also illustrates additional exposure of the first sheet metal member 720 and the corresponding wings 728 through the bottom of the housing 710 for surface mounting of the LED package 700 to a PCB. The additional exposure of the first sheet metal member and corresponding wings may provide a larger primary path for heat conduction from the surface of the LED chip to the LED lead frame and the PCB or other suitable mounting surface.

Figure 8:
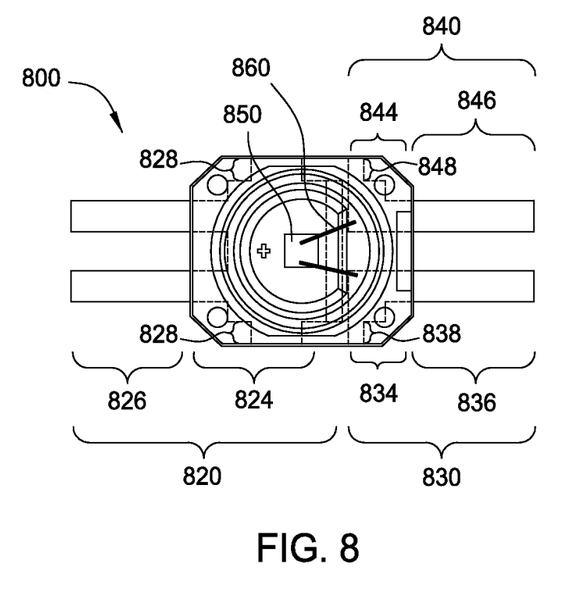
FIG. 8 illustrates an LED device in which three sheet metal members are employed according to an embodiment of the present invention.

FIG. 8 illustrates a top view of an LED package 800, in accordance with another embodiment of the invention, in which a third sheet metal member is implemented. As in other embodiments, a p-doped side of an LED chip 850 may be intimately connected to a first sheet metal member 820, where the first sheet metal member may have an electrode region 824, one or more electric terminals 826, and at least one wing 828. Further, as in other embodiments, there is a second sheet metal member 830 that may be electrically connected to the LED chip 850 through a bond wire 860, made of a conductive material, such as gold. As described above, the second sheet metal member 830 may also have an electrode region 834, one or more electric terminals 836, and at least one wing 838. However, in this embodiment there is a third sheet metal member 840 that may be electrically connected to the LED chip 850 through a bond wire 860. Similar to the first and second sheet metal members, the third sheet metal member 840 may have an electrode region 844, one or more electric terminals 846, and at least one wing 848.

Figure 9:
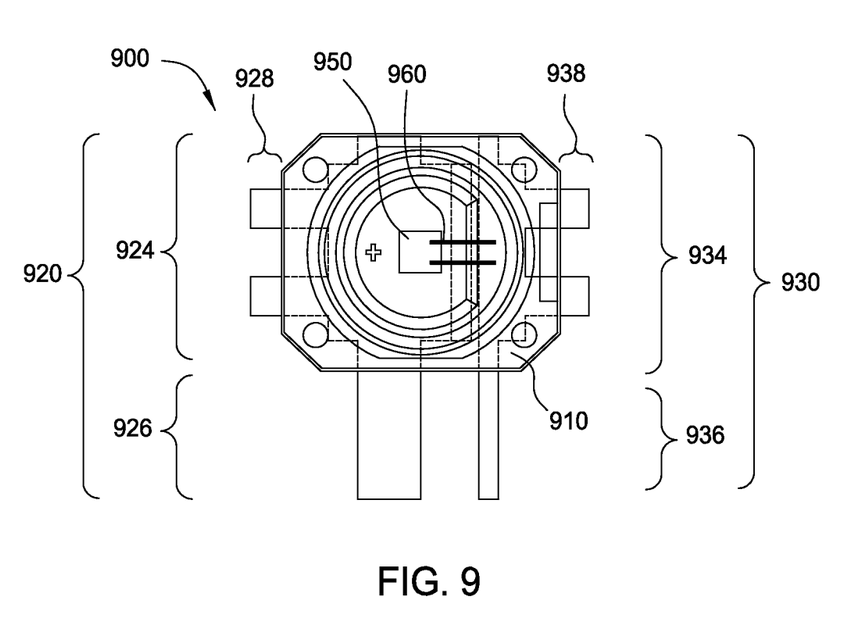
FIG. 9 illustrates an LED device in which the wings of the sheet metal members extend beyond the housing according to an embodiment of the present invention.

FIG. 9 illustrates a top view of an LED package 900, in accordance with another embodiment of the invention. In embodiments similar to that illustrated in FIG. 9, an electric terminal 926 of a first sheet metal member 920 and an electric terminal 936 of a second sheet metal member 930 are configured for through-hole mounting. As in previous embodiments, a p-doped side of an LED chip 950 may be intimately connected to the first sheet metal member 920, while the n-doped side of the LED chip 950 may be electrically connected to the second sheet metal member 930 through a conductive bond wire 960. As described above, portions of both the first sheet metal member 920 and the second sheet metal member 930 may be embedded in a resin or plastic housing 910. Further, both the first sheet metal member 920 and the second sheet metal member 930 may have an electrode region 924/934, one or more electric terminals 926/936, and at least one wing 928/938. However, in some embodiments the wings 928/938 may extend laterally beyond the sides of the LED housing 910, as illustrated in FIG. 9. These extensions may increase heat dissipation through convection.

In some embodiments of the present invention, the electrode of the first sheet metal member, which includes the heat transfer section, may be thinned, wherein the thinning may be done by a coining, stamping, or etching process. Similarly, the one or more wings of any sheet metal members may be thinned, wherein the thinning may be done by a coining, stamping, or etching process.

While the foregoing is directed to embodiments of the present invention, other and further embodiments of the invention may be devised without departing from the basic scope thereof, and the scope thereof is determined by the claims that follow.

The invention claimed is:

1. A light-emitting diode (LED) device, comprising:
   a housing having a recessed volume;
   an LED semiconductor die having first and second electrodes and disposed in the recessed volume of the housing;
   a first metal member having one or more leads for external connection and one or more wings protruding from a main portion of the first metal member, wherein the first metal member is electrically and thermally coupled to a first electrode of the LED die;
   a second metal member having one or more leads for external connection, the second metal member being electrically coupled to the second electrode of the LED die; and
   a third metal member having one or more leads for external connection, the third metal member being electrically coupled to the second electrode of the LED die.

2. The LED device of claim 1, wherein at least one of the wings comprises one or more holes.

3. The LED device of claim 1, wherein at least one of the wings extends beyond a surface of the housing.

4. The LED device of claim 1, wherein at least one of the wings is sloped or tiered above a remaining portion of the first metal member.

5. The LED device of claim 1, wherein the LED device is a surface-mount device.

* * * * *